(12) United States Patent
Lowack et al.

(10) Patent No.: US 7,028,399 B2
(45) Date of Patent: Apr. 18, 2006

(54) WIRING PROCESS

(75) Inventors: Klaus Lowack, Erlangen (DE);
Guenter Schmid, Hemhofen (DE);
Recai Sezi, Roettenbach (DE); Ute Zschieschang, Erlangen (DE)

(73) Assignee: Infineon Technologies AG, Munich (DE)

( * ) Notice: Subject to any disclaimer, the term of this patent is extended or adjusted under 35 U.S.C. 154(b) by 538 days.

(21) Appl. No.: 10/145,393

(22) Filed: May 14, 2002

(65) Prior Publication Data

US 2002/0184756 A1 Dec. 12, 2002

(30) Foreign Application Priority Data

May 31, 2001 (DE) ................................. 101 26 734

(51) Int. Cl.
*H05K 3/02* (2006.01)
(52) U.S. Cl. .................... 29/846; 29/831; 29/842; 427/306; 205/123; 174/257
(58) Field of Classification Search ................ 29/846, 29/831, 842, 854, 852; 205/118, 123; 174/256–258, 174/261, 250; 427/302, 304–306, 96.1, 98.4, 427/98.5, 99.1, 99.5
See application file for complete search history.

(56) References Cited

U.S. PATENT DOCUMENTS

| | | | | |
|---|---|---|---|---|
| 4,096,043 A | * | 6/1978 | De Angelo | 205/118 |
| 4,261,800 A | * | 4/1981 | Beckenbaugh et al. | 205/118 |
| 4,445,979 A | * | 5/1984 | Lutfy et al. | 205/101 |
| 5,227,013 A | * | 7/1993 | Kumar | 216/18 |
| 5,264,107 A | * | 11/1993 | Bentson et al. | 205/86 |
| 5,528,000 A | * | 6/1996 | Allardyce et al. | 174/266 |
| 5,817,405 A | * | 10/1998 | Bhatt et al. | 428/209 |
| 5,878,487 A | * | 3/1999 | McMillan et al. | 29/852 |
| 6,117,707 A | * | 9/2000 | Badehi | 438/113 |
| 6,132,587 A | * | 10/2000 | Jorne et al. | 205/123 |
| 6,440,289 B1 | * | 8/2002 | Woo et al. | 205/103 |
| 6,640,433 B1 | * | 11/2003 | Kuroda et al. | 29/846 |
| 6,709,562 B1 | * | 3/2004 | Andricacos et al. | 205/122 |

FOREIGN PATENT DOCUMENTS

DE 19705745 A1 8/1998

* cited by examiner

*Primary Examiner*—A. Dexter Tugbang
*Assistant Examiner*—Terri Lynn Smith
(74) *Attorney, Agent, or Firm*—Jenkins, Wilson & Taylor, P.A.

(57) ABSTRACT

The present invention provides a process for wiring electrical contact sites, in particular on the surface of an electronic or microelectronic component, with the following steps: applying and patterning at least one dielectric on the component surface; currentlessly depositing a conductor starting layer for producing metal wiring interconnects and substitute contact sites with short-circuit contacts for interconnecting the individual metal wiring interconnects and the corresponding electrical contact sites; reinforcing the conductor starting layer by a common electrodepositing process; and separating the short-circuit contacts for separating the electrical contact sites or the contact sites of the wiring from one another.

15 Claims, 1 Drawing Sheet

WIRING PROCESS

This application claims the benefit of German application number 101 26 734.7, filed May 31, 2001, currently pending, the disclosure of which is hereby incorporated by reference in its entirety.

FIELD OF THE INVENTION

The invention relates to a process for wiring electrical contact sites, in particular on the surface of an electronic or microelectronic component.

BACKGROUND OF THE INVENTION

With the trend toward designing semiconductor elements, such as ICs and LSIs, in a highly integrated form and in very small sizes and also for high-speed processes, in recent years the conductors formed on the printed circuit board for mounting the component have been made very fine, creating an extremely dense system of lines, in particular in the edge region. These systems require compact attachment of the component on the printed circuit board. In many technical applications, what is known as the flip-chip technique is used as a basis for establishing contacts of components or chips on the printed circuit board, for example in the production of chip cards, to connect the electrodes of the component directly to the lines of the printed circuit board.

However, on account of the small-sized systems, the electrical contact sites are spaced so close together that the electrical contact sites cannot be transferred onto the printed circuit board in the flip-chip process in a way that is certain to maintain contact.

Consequently, wiring of the original electrical contact sites is necessary to increase the distances between the individual contact sites.

The applicant knows of processes in which a number of components on a common wafer are wired simultaneously.

For example, it has previously been the practice to arrange a metal layer on a patterned insulating layer of an electronic or microelectronic component in such a way that firstly a thin metal layer is applied to the dielectric by means of a vacuum process. After covering with photoresist and patterning of the latter by means of photolithography, the metal layer is chemically or electrochemically reinforced, the resist is subsequently stripped and the first thin metal layer is etched back.

This process is complex and expensive. What is more, the stripping of the resist can lead to particle formation and, accordingly, to a reduction in yield.

Furthermore, the applicant knows of processes in which a metal layer is currentlessly deposited on a patterned dielectric.

However, the metallization created by this process has only small thicknesses. Consequently, it is suitable only for wiring components in cases where the connections of the component are supplied with only moderate current densities.

It is therefore the object of the present invention to provide a process which wires electrical contact sites on the surface of an electronic or microelectronic component with little time expended, in a simple way and with relatively low costs, the metal wiring interconnects being able to carry relatively great current densities.

This object is achieved according to the invention by the process with the features specified in patent claim 1.

SUMMARY OF THE INVENTION

The present invention provides a process for wiring electrical contact sites on the surface of an electronic or microelectronic component, with the following steps: applying and patterning at least one dielectric on the component surface; currentlessly depositing a conductor starting layer on a corresponding patterned layer that has been provided and can be metallized, for producing metal wiring interconnects and substitute contact sites with short-circuit contacts for interconnecting the individual metal wiring interconnects and consequently the electrical contact sites; reinforcing the conductor starting layer by a common electrodepositing process; and separating the short-circuit contacts for separating the individual electrical contact sites from one another.

The process according to the invention offers the advantage that the metal wiring interconnects created have a greater thickness in a shorter time and can consequently carry a greater current density.

Moreover, the metallization process can be carried out simply and quickly, since all the electrical connections are short-circuited with one another, allowing a uniform and common electrodepositing process to be carried out.

Advantageous developments and improvements of the process specified in claim 1 can be found in the subclaims.

According to a preferred development, a number of components on a common wafer are wired simultaneously. This considerably reduces the expenditure on producing the individual components and reduces the production costs.

According to a further preferred development, the short-circuit contacts for the connection of the individual electrical contact sites are arranged in isolation trenches at the peripheral edge of the individual components. When the individual components are separated, for example by sawing along the isolation trenches, the short-circuit contacts are consequently also automatically separated, saving a step in the process and reducing the amount of work involved.

According to a further preferred development, the short-circuit contacts are realized by means of a ground plane in connection with electro and/or laser fuses. This is a possibility for simple separation of the short-circuit contacts at the end of the production process for the case in which the short-circuit contacts are not arranged in the isolation trenches.

According to a further preferred development, the component surface is formed as a non-metallizable substrate. In the case of a metallizable substrate, the dielectric is applied to the substrate as a non-metallizable dielectric in the form of a mask. For example, a non-metallizable layer, preferably a monomolecular layer, is applied by introducing it into a masking solution.

According to a further preferred development, the dielectric is formed as a metallizable dielectric or metallizable buffer layer, for example of polybenzoxazole, polyimide, siloxane-based polymers or polymers of acrylonitrile butadiene styrene.

According to a further preferred development, the component surface is formed as a metallizable substrate, the dielectric in this case being applied to the substrate as a non-metallizable dielectric patterned in the form of a mask or unpatterned in a finite layer thickness. This is the negative image of the previously described metallizable dielectric. The non-metallizable layer may also be formed as a monomolecular layer or as a self-organized monolayer.

According to a further preferred development, the conductor starting layer is electrolessly deposited by means of, in particular, a nickel and/or copper electrolyte. This represents a simple way of producing the conductor starting layer.

According to a further preferred development, the conductor starting layer is reinforced [lacuna] copper layer applied by means of an electrodepositing process, in particular a standard or tampon electrodepositing process.

Preferred embodiments of the process according to the invention are described below with reference to the accompanying figures, to explain features essential for the invention.

BRIEF DESCRIPTION OF THE DRAWING FIGURES

In the figures.

In the figures, the same reference numerals designate components which are the same or functionally the same.

DETAILED DESCRIPTION OF THE PREFERRED EMBODIMENTS

Figure 1:
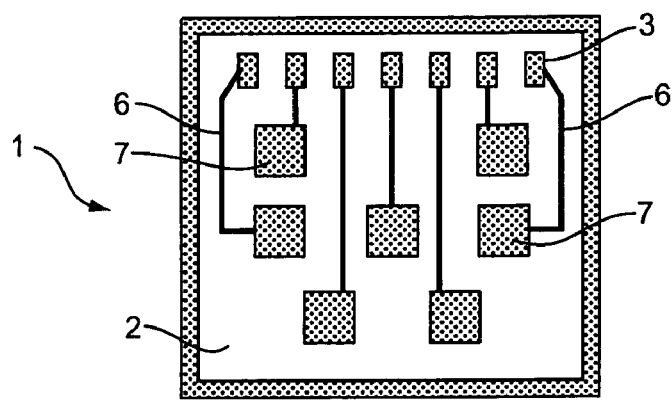
FIG. 1 shows a schematic representation of a finished wiring of an electronic or microelectronic component.

On the basis of FIG. 1, the wiring principle is firstly to be explained. On the surface 2 of a component 1 arranged together with other components on a wafer, predetermined electrical contact sites or pads 3 are initially provided. As already explained above, these are spaced too close together for the flip-chip technique, so that stable electrical contacting is not ensured. Consequently, metal wiring interconnects 6 are respectively created from the individual electrical contact sites 3 to substitute contact sites 7 distributed on the entire surface 2 of the component 1. These are then at the requisite distance from one another and have the required contact size.

Figure 2:
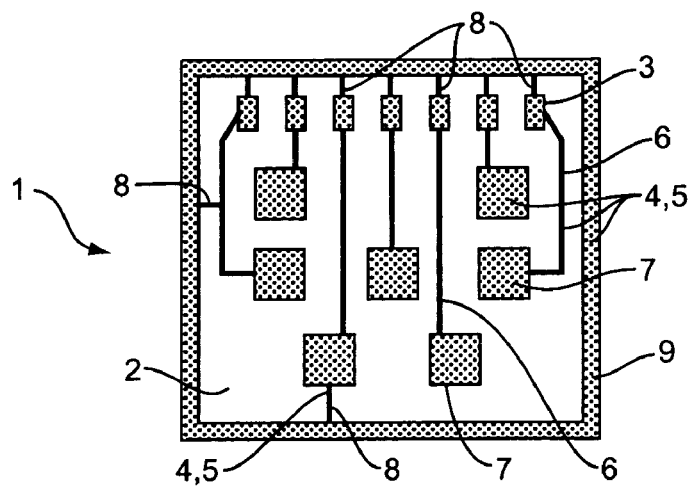
FIG. 2 shows a schematic representation of a wiring arrangement during the process according to an exemplary embodiment of the present invention.

FIG. 2 illustrates a schematic representation of a component during a wiring process according to an exemplary embodiment of the present invention, which is described in more detail below.

Firstly, an electrolessly metallizable dielectric 4 is applied—for example printed on in a way known per se—to the surface 2 of the component 1, i.e. to the substrate 2, said dielectric advantageously having the patterning that is shaded dark in FIG. 2 (except for the contact sites 3).

This patterning ensures that all the metal wiring interconnects 6 or substitute contact sites 7 are electrically connected to one another via short-circuit contacts 8. The short-circuit contacts 8 are advantageously arranged in isolation trenches 9, which represent the delimitations of the individual components 1 from one another on the common wafer.

Next, a conductor starting layer 5 is currentlessly deposited on the metallizable dielectric 2. For example, after rinsing with deionized water, for this purpose the arrangement is immersed in a heated commercially available ionogenic palladium solution for a certain period of time for seeding the dielectric with a noble metal. Subsequently, reducing is carried out for a certain immersion time, for example with an alkaline sodium borohydride solution. Lastly, a homogeneous copper or nickel layer 5 with good adhesion properties is obtained on the dielectric by immersion in a chemical copper or nickel bath. This conductor starting layer 5 is applied completely homogeneously to the dielectric and consequently constitutes the same structure of the dielectric 4 represented in FIG. 2.

As the next step, the conductor starting layer 5 is uniformly reinforced by means of an electrodepositing process, in particular a standard or tampon electrodepositing process. Since, as can be seen in FIG. 2, all the electrical contact sites 3, metal wiring interconnects 6 and substitute contact sites 7 are electrically connected to one another, a single electrical connection contact is sufficient for the electrodepositing process.

Over the isolation trenches 9 connecting the individual components 1 of the wafer, even a single electrical connection contact is sufficient for the electro-depositing process of all the components 1 located on a wafer. As a result, a number of components on a wafer are simultaneously wired in a simple manner with such a thickness that great current densities can be carried by the corresponding lines.

In particular, the complete wafer can preferably be electrically contacted from the rear side for the electrodepositing, since normally a PIN of the chip has direct contact with the substrate.

In the case of a metallizable substrate 2, for example formed from polybenzoxazole, polyimide, polybenzimidazole and copolymers of this compound, siloxane-based polymers or polymers of acrylonitrile butadiene styrene, it can be introduced into a corresponding masking solution known per se, whereby a non-metallizable layer is applied to said substrate. Likewise, a printing process may be used for this purpose. This non-metallizable layer is advantageously a monomolecular layer or dielectric with a finite layer thickness. After applying this monomolecular non-metallizable layer, the process described above can be analogously applied.

The reinforcement by electrodeposition described above is completed in a few minutes and simply requires a conductive surface, which is ensured by the electrical interconnection of all the metal wiring interconnects.

The original electrical contact sites 3 located on the substrate 2, preferably aluminum pads 3 or pads of other suitable materials, are preserved during the electroless deposition of the conductor starting layer 5 as a result of the pH of the copper or nickel bath. Furthermore, a nickel or copper layer, for example, may simultaneously serve as a diffusion barrier for the copper or nickel reinforcing layer subsequently applied over it.

As the next step, the individual 1 components located on a wafer are separated along the isolation trenches 9, for example by means of sawing. This separation simultaneously brings about a separation of each electrical contact site 3 or the assigned metal wiring interconnects 6 from one another. This allows an additional step in the process after the joint electrodeposition to be saved—the separating of the metal interconnects 6 connected to one another for the electrodeposition.

It is likewise conceivable as a further exemplary embodiment that the component surface 2 is formed as a metallizable substrate 2. In the case of this exemplary embodiment, a non-metallizable layer may be applied over the full surface area of the metallizable substrate 2 and the same procedure followed as in the process described above according to the first exemplary embodiment.

Furthermore, a non-metallizable mask, preferably a monomolecular layer or a dielectric with a finite layer thickness, and having the structure represented in white in FIG. 2, may also be applied to the substrate. This corresponds to the negative of the shaded structure represented in FIG. 2, with an initially non-metallizable dielectric.

The then still exposed regions of the currentlessly metallizable substrate 2 are metallized in a way analogous to the process described above and reinforced by an electrodepositing process.

A monomolecular layer, known as a self-assembled monolayer, of an appropriate substance which prevents metallization of a correspondingly covered region is likewise adequate for the masking.

Figure 3:
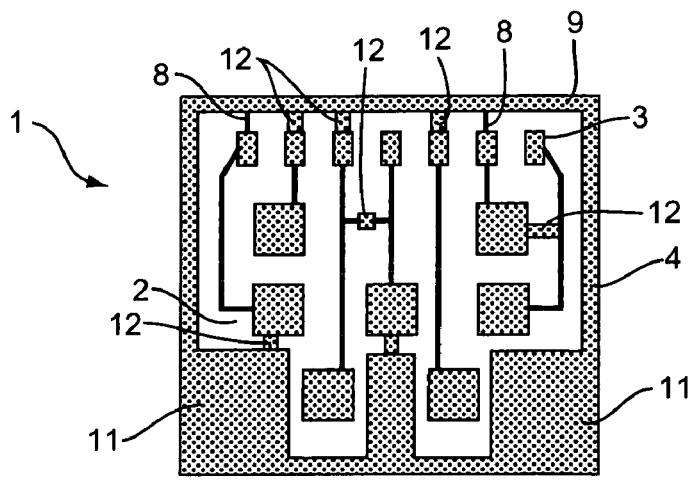
FIG. 3 shows a schematic representation of a wiring arrangement during the process according to a further exemplary embodiment of the present invention.

FIG. 3 shows a schematic representation of a further exemplary embodiment of a wiring process.

According to this exemplary embodiment, the short-circuit contacts 8 are accomplished in the course of the process by means of ground planes 11 in connection with electro and/or laser fuses 12. This likewise permits a continuous conductive surface to be achieved in a simple way for the electrodeposition in electrolytic baths.

However, in this case complete separation of the individual metal wiring interconnects 6 does not take place during the separation of the individual components 1 from one another by sawing, for example, along the isolation trenches 9, since the short-circuit contacts are not arranged on or in the isolation trenches 9.

Separating of the short-circuit contact takes place in the case of electro fuses in an electrical manner and in the case of laser fuses by means of a laser beam. In both cases, the electrical connection of the individual electrical contact sites 3 and of the substitute contact sites 7 is interrupted for the further use of the component 1.

Although the present invention has been described above on the basis of preferred exemplary embodiments, it is not restricted to these but can be modified in a variety of ways.

For example, other suitable materials may be used in the individual process steps.

LIST OF REFERENCE NUMERALS

| | |
|---|---|
| 1 | component |
| 2 | component surface |
| 3 | electrical contact sites/pads |
| 4 | metallizable dielectric |
| 5 | conductor starting layer |
| 6 | metal wiring interconnects |
| 7 | contact sites of the wiring |
| 8 | short-circuit contacts |
| 9 | isolation trenches |
| 11 | ground planes |
| 12 | electro/laser fuses |

The invention claimed is:

1. A process for wiring electrical contact sites on a surface of an electronic component, comprising:
applying at least one dielectric on the surface of the electronic component;
currentlessly depositing a conductor starting layer for producing metal wiring interconnects and substitute contact sites electrically connected to a corresponding one of the metal wiring interconnects;
electrically interconnecting each of the metal wiring interconnects with one another such that each is electrically short-circuited relative to one another;
reinforcing the conductor starting layer by an electrodepositing process; and
separating interconnections between each of the metal wiring interconnects such that each is not electrically short-circuited relative to one another.

2. The process of claim 1, further comprising wiring components on a common wafer simultaneously.

3. The process of claim 1, further comprising arranging the electrical interconnections between each of the metal wiring interconnects in isolation trenches.

4. The process of claim 3, further comprising separating components along the isolation trenches such that the electrical interconnections between each of the metal wiring interconnects we broken and the metal wiring interconnects are no longer electrically short-circuited relative to one another.

5. The process of claim 1, wherein electrically interconnecting each of the metal wiring interconnects comprises electrically interconnecting each of the metal wiring interconnects by using a technique selected from the group consisting of: at least one ground plane, electrofusing or laser fusing.

6. The process of claim 1, wherein applying at least one dielectric on the surface of the electronic component comprises applying the at least one dielectric on a non-metallizable substrate.

7. The process of claim 1, wherein applying at least one dielectric on the surface of the electronic component comprises applying the at least one dielectric on a metallizable substrate with which a non-metallizable layer has been associated.

8. The process of claim 7, further comprising forming the non-metallizable layer as a monomolecular layer.

9. The process of claim 1, further comprising forming the at least one dielectric from a metallizable dielectric selected from the group consisting of: polybenzoxazole, polyimide, polybenzimidazole, copolymers of polybenzimidazole, siloxane-based polymers, and polymers of acrylonitrile butadiene styrene.

10. The process of claim 1, further comprising forming the surface of the electronic component as a metallizable substrate to which a non-metallizable mask is applied.

11. The process of claim 10, further comprising forming the non-metallizable mask as a monomolecular layer.

12. The process of claim 10, further comprising forming the non-metallizable mask as a dielectric with a finite layer thickness.

13. The process of claim 1, wherein currentlessly depositing the conductor starting layer comprises electrolessly depositing by means of an electrolyte selected from the group consisting of: a nickel electrolyte, a copper electrolyte, and a nickel and copper electrolyte.

14. The process of claim 1, further comprising reinforcing the conductor starting layer with a copper layer applied by means of an electrodepositing process.

15. The process of claim 14, wherein the electrodepositing process comprises a tampon electrodepositing process.

* * * * *